United States Patent
Lin et al.

(10) Patent No.: US 10,056,462 B2
(45) Date of Patent: Aug. 21, 2018

(54) METAL GATE STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chih Hsiung Lin, Hsinchu County (TW); Chia-Der Chang, Hsinchu (TW); Fan-Yi Hsu, Miaoli County (TW); Pin-Cheng Hsu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/458,512

(22) Filed: Aug. 13, 2014

(65) Prior Publication Data
US 2016/0049491 A1 Feb. 18, 2016

(51) Int. Cl.
*H01L 29/49* (2006.01)
*H01L 29/78* (2006.01)
(Continued)

(52) U.S. Cl.
CPC .... *H01L 29/4966* (2013.01); *H01L 21/28088* (2013.01); *H01L 21/32139* (2013.01);
(Continued)

(58) Field of Classification Search
CPC ............ H01L 29/4966; H01L 29/4958; H01L 29/517; H01L 29/518; H01L 29/78;
(Continued)

(56) References Cited

U.S. PATENT DOCUMENTS 5,989,966 A * 11/1999 Huang ................ H01L 29/6659
257/E21.149
6,429,062 B1 * 8/2002 Rubin ................ H01L 21/2652
257/E21.337
(Continued)

FOREIGN PATENT DOCUMENTS

CN 102903742 A 1/2013

OTHER PUBLICATIONS

Office action dated Apr. 6, 2018 issued by the China State Intellectual Property Office for counterpart application 201410803489.6.
(Continued)

*Primary Examiner* — Asok K Sarkar
*Assistant Examiner* — Grant Withers
(74) *Attorney, Agent, or Firm* — WPAT, P.C., Intellectual Property Attorneys; Anthony King

(57) ABSTRACT

The present disclosure provides a semiconductor structure includes a semiconductor layer having a surface, and an interlayer dielectric (ILD) defining a metal gate over the surface of the semiconductor layer. The metal gate includes a high-k dielectric layer, a capping layer, and a work function metal layer. A thickness of the capping layer sidewall distal to a corner of the capping layer, is substantially thinner than a thickness which is around center of the capping layer bottom. The present disclosure provides a method for manufacturing a semiconductor structure. The method includes forming a metal gate recess, forming a high-k dielectric layer, forming a first capping layer, forming a second capping layer on the first capping layer, removing or thinning down the first capping layer sidewall, and removing the second capping layer.

19 Claims, 15 Drawing Sheets

(51) Int. Cl.
  *H01L 29/51* (2006.01)
  *H01L 29/66* (2006.01)
  *H01L 21/28* (2006.01)
  *H01L 21/3213* (2006.01)
(52) U.S. Cl.
  CPC ........ *H01L 29/517* (2013.01); *H01L 29/6656* (2013.01); *H01L 29/66545* (2013.01); *H01L 29/66795* (2013.01); *H01L 29/7851* (2013.01); *H01L 21/32134* (2013.01); *H01L 29/513* (2013.01)
(58) Field of Classification Search
  CPC ............... H01L 29/785; H01L 29/7853; H01L 29/7831; H01L 27/0886; H01L 27/0924; H01L 27/10826; H01L 27/1211
  See application file for complete search history.

(56) References Cited

U.S. PATENT DOCUMENTS

| | | | | |
|---|---|---|---|---|
| 7,390,709 B2* | 6/2008 | Doczy | ............ | H01L 21/823842 257/E21.637 |
| 7,964,460 B2* | 6/2011 | Li | ............ | H01L 21/28194 257/371 |
| 8,383,473 B1* | 2/2013 | Triyoso | ............ | H01L 29/66545 257/E21.444 |
| 2008/0265322 A1* | 10/2008 | Lin | ............ | H01L 21/28079 257/347 |
| 2010/0059833 A1* | 3/2010 | Yu | ............ | H01L 21/823807 257/410 |
| 2010/0065925 A1* | 3/2010 | Huang | ............ | H01L 29/42376 257/410 |
| 2010/0087038 A1* | 4/2010 | Chung | ............ | H01L 21/823842 438/199 |
| 2010/0244141 A1* | 9/2010 | Beyer | ............ | H01L 21/28088 257/369 |
| 2010/0301427 A1* | 12/2010 | Lenski | ............ | H01L 21/28088 257/392 |
| 2011/0062526 A1* | 3/2011 | Xu | ............ | H01L 21/823835 257/369 |
| 2011/0147858 A1* | 6/2011 | Lim | ............ | H01L 29/4966 257/412 |
| 2011/0186915 A1* | 8/2011 | Scheiper | ............ | H01L 21/28105 257/288 |
| 2011/0201164 A1* | 8/2011 | Chung | ............ | H01L 21/823807 438/229 |
| 2011/0223736 A1* | 9/2011 | Lin | ............ | H01L 21/823821 438/305 |
| 2011/0248348 A1* | 10/2011 | Gan | ............ | H01L 29/66795 257/369 |
| 2011/0248359 A1* | 10/2011 | Hwang | ............ | H01L 21/823842 257/410 |
| 2012/0018810 A1* | 1/2012 | Chambers | ............ | H01L 21/28088 257/369 |
| 2012/0049247 A1* | 3/2012 | Lee | ............ | H01L 21/28114 257/288 |
| 2012/0052641 A1* | 3/2012 | Lee | ............ | H01L 21/28088 438/270 |
| 2012/0132998 A1* | 5/2012 | Kwon | ............ | H01L 21/28088 257/369 |
| 2012/0217590 A1* | 8/2012 | Babich | ............ | H01L 21/28088 257/410 |
| 2012/0238088 A1* | 9/2012 | Xiang | ............ | H01L 21/823842 438/592 |
| 2012/0292715 A1* | 11/2012 | Hong | ............ | H01L 21/845 257/392 |
| 2012/0326243 A1* | 12/2012 | Huang | ............ | H01L 29/4966 257/410 |
| 2013/0020657 A1* | 1/2013 | Lu | ............ | H01L 21/823842 257/411 |
| 2013/0020658 A1* | 1/2013 | Guo | ............ | H01L 29/4958 257/412 |
| 2013/0026637 A1* | 1/2013 | Hou | ............ | H01L 21/28088 257/770 |
| 2013/0049109 A1* | 2/2013 | Lim | ............ | H01L 21/823842 257/334 |
| 2013/0099307 A1* | 4/2013 | Tseng | ............ | H01L 21/28088 257/330 |
| 2013/0102145 A1* | 4/2013 | Huang | ............ | H01L 21/32139 438/595 |
| 2013/0154012 A1* | 6/2013 | Fu | ............ | H01L 21/28088 257/368 |
| 2013/0154019 A1* | 6/2013 | Ando | ............ | H01L 21/823842 257/369 |
| 2013/0161762 A1* | 6/2013 | Kelly | ............ | H01L 29/66795 257/401 |
| 2013/0299918 A1* | 11/2013 | Kim | ............ | H01L 29/78 257/402 |
| 2014/0070283 A1* | 3/2014 | Kim | ............ | H01L 29/4236 257/288 |
| 2014/0077374 A1* | 3/2014 | Lin | ............ | H01L 23/481 257/741 |
| 2014/0299939 A1* | 10/2014 | Kim | ............ | H01L 21/02697 257/369 |
| 2014/0319626 A1* | 10/2014 | Jangjian | ............ | H01L 29/66545 257/411 |
| 2015/0008491 A1* | 1/2015 | Lim | ............ | H01L 29/42368 257/288 |
| 2015/0041905 A1* | 2/2015 | Xie | ............ | H01L 29/6656 257/369 |
| 2015/0187946 A1* | 7/2015 | Park | ............ | H01L 29/7851 257/368 |
| 2015/0206951 A1* | 7/2015 | Lin | ............ | H01L 29/517 257/411 |
| 2015/0206963 A1* | 7/2015 | Ho | ............ | H01L 21/31111 257/411 |
| 2015/0221640 A1* | 8/2015 | Li | ............ | H01L 27/088 257/401 |
| 2015/0255295 A1* | 9/2015 | Jacob | ............ | H01L 29/66818 438/425 |
| 2015/0262823 A1* | 9/2015 | Hung | ............ | H01L 21/2855 257/368 |
| 2015/0262827 A1* | 9/2015 | Khaderbad | ............ | H01L 21/28506 257/412 |
| 2015/0263168 A1* | 9/2015 | Hsiao | ............ | H01L 29/7833 257/402 |
| 2015/0279838 A1* | 10/2015 | Tsao | ............ | H01L 29/66553 257/383 |
| 2015/0325690 A1* | 11/2015 | Liu | ............ | H01L 29/78 257/288 |

OTHER PUBLICATIONS

US20130026637 is the counterpart for CN 102903742A.

* cited by examiner

METAL GATE STRUCTURE AND MANUFACTURING METHOD THEREOF

FIELD

The disclosure relates to a metal gate in a semiconductor structure.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. As the dimensions of transistors decrease, the thickness of the gate oxide must be reduced to maintain performance with the decreased gate length. However, in order to reduce gate leakage, high dielectric constant (high-k) gate insulator layers are used which allow greater physical thicknesses while maintaining the same effective capacitance as would be provided by a typical gate oxide used in larger technology nodes.

Additionally, as technology nodes shrink, in some IC designs, there has been a desire to replace the typically polysilicon gate electrode with a metal gate (MG) electrode to improve device performance with the decreased feature sizes. One process of forming the MG electrode is termed "gate last" process, as opposed to another MG electrode formation process termed "gate first". The "gate last" process allows for reduced number of subsequent processes, including high temperature processing, that must be performed after formation of the gate.

Thus, what is desired is a method and semiconductor device providing differently configured metal gate structures for each NFET, PFET, N-FinFET and P-FinFET formed on a substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
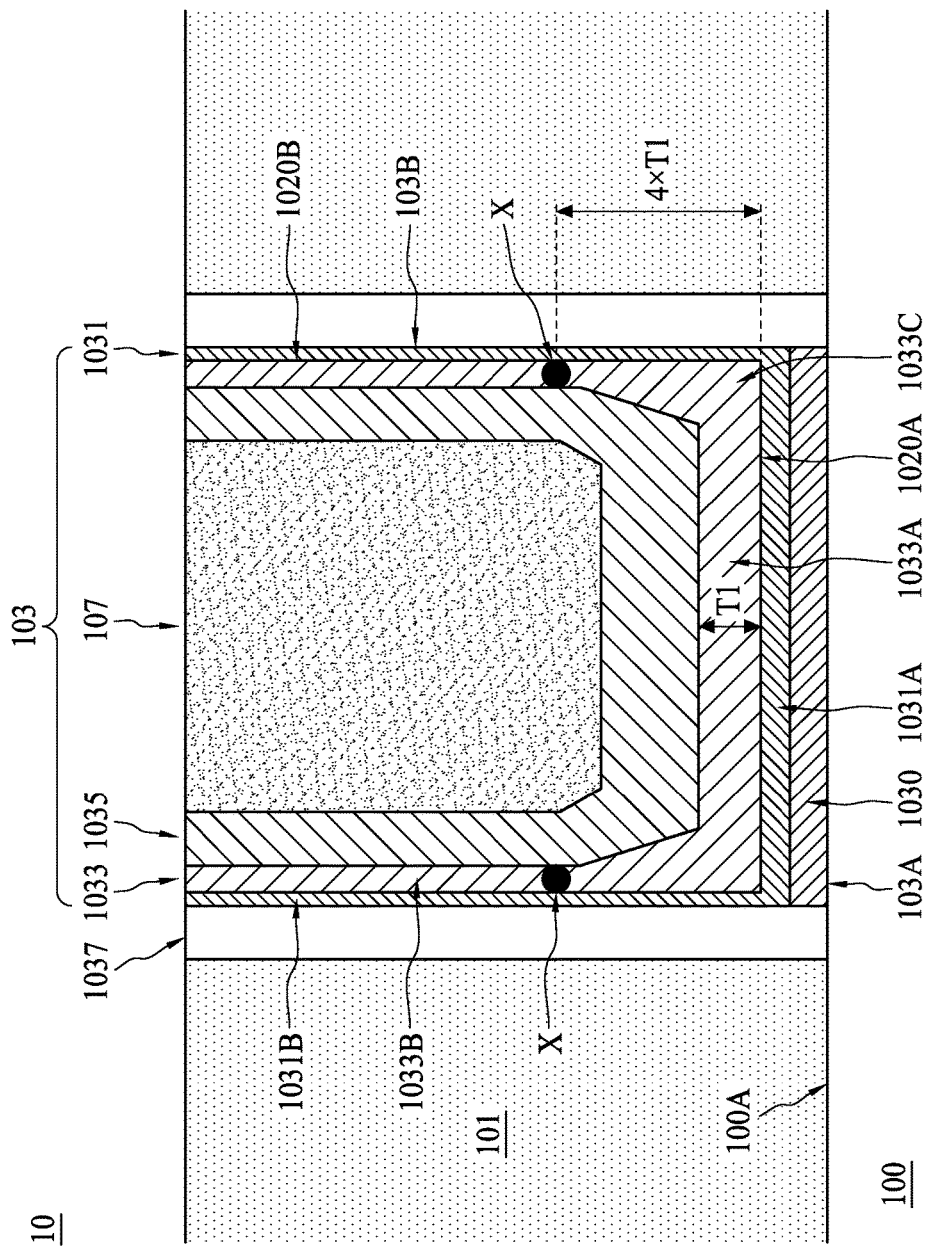
FIG. 1 is a cross sectional view of a semiconductor structure with a metal gate in accordance with some embodiments of the present disclosure.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention. It is to be understood that the following disclosure provides many different embodiments or examples for implementing different features of various embodiments. Specific examples of components and arrangements are described below to simplify the present disclosure. These are, of course, merely examples and are not intended to be limiting.

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Aluminum implantation is used to reduce the flatband voltage ($V_{FB}$) and the effective work function of a metal gate (MG) structure close to a channel region of a transistor. Metal elements such as aluminum have been used as a prominent vehicle to adjust a threshold voltage of an N-type transistor given its ability to attract negative carriers in the channel region of the N-type transistor and hence lower the threshold voltage. In an MG structure, the aluminum ions are implanted into an N-work function metal layer that allows the aluminum atoms to diffuse toward the underlying capping layer or dielectric layer positioned closer to the channel region of the N-type transistor.

As previously discussed, the aluminum atoms reduce the threshold voltage of the N-type transistor under the condition that the channel length (i.e. distance between a source region and a drain region underneath a metal gate structure) is long enough, for example, more than 40 nm. However, as the channel length scales down according to Moore's law, weak corner turn on (WCTO) effect becomes a problem preventing the threshold voltage from decreasing. Because a distance between an N-work function metal layer and a bottom corner of the metal gate is substantially greater than a distance between an N-work function metal layer and a center bottom of the metal gate, the capping layer or dielectric layer proximal to the bottom corner of the metal gate receives fewer aluminum atoms compared to the capping layer or dielectric layer proximal to the center bottom of the metal gate. Hence, the threshold voltage close to the bottom corner of the metal gate cannot be reduced to the same extent as the threshold voltage close to the center bottom of the metal gate does.

The WCTO effect is especially severe in a short channel length metal gate because the bottom corner portion weighs more in the short channel length metal gate than that in the long channel length metal gate. It is shown that given the same aluminum concentration in the N-work function metal layer, the measured threshold voltage increases when the channel length decreases. The WCTO effect can be observed when metal gates with a mix of channel lengths are manufactured together on a same wafer. The same aluminum concentration is implanted or deposited into the N-work function metal layer but the result shows a lower threshold voltage in a transistor with a longer channel length while a higher threshold voltage in a transistor with a shorter channel length.

Some embodiments of the present disclosure provide a semiconductor structure with a metal gate. An N-work function metal layer in the metal gate is lining an engineered underlying capping layer in a way to allow more aluminum atoms to diffuse to the bottom corner of the metal gate, and hence resolving the problems caused by the WCTO effect.

Some embodiments of the present disclosure provide a method for manufacturing a semiconductor structure with a metal gate having an N-work function metal layer, lining an engineered underlying capping layer in a way to allow more aluminum atoms to diffuse to the bottom corner of the metal gate.

FIG. 1 shows a cross sectional view of a semiconductor structure 10 with a metal gate 103. The semiconductor structure 10 has a semiconductor layer 100, where an interlayer dielectric layer (ILD) 101 defining and surrounding the metal gate 103 is positioned over. A spacer 1037 is disposed between the ILD 101 and the metal gate 103. The semiconductor layer 100 has a surface 100A that is proximal to a channel region of a transistor. The metal gate 103, the spacer 1037 and the ILD 101 are positioned over the surface 100A of the semiconductor layer 100. In some embodiments, the semiconductor layer 100 referred herein is a bulk semiconductor substrate on which various layers and device structure are formed. In some embodiments, the bulk substrate includes silicon or a compound semiconductor, such as GaAs, InP, Si/Ge, or SiC. Various layers can be formed on the semiconductor layer 100. For example, dielectric layers, doped layers, polysilicon layers or conductive layers. Various devices can be formed on the semiconductor layer 100. For example, transistors, resistors, and/or capacitors, which may be interconnected through an interconnect layer to additional integrated circuits.

In some embodiments, the semiconductor structure 10 can be a planar or a non-planar transistor structure. For example, a MOSFET or a FinFET structure possessing various features in the semiconductor layer 100. The various features include, but not limited to, lightly doped source/drain regions (N-type and P-type LDD), source/drain (S/D) regions, silicide features, contact etch stop layer (CESL). It should be noted that strained structures in the semiconductor layer 100, such as silicon germanium (SiGe) and silicon carbide (SiC) stressors may be formed in the P-type and/or N-type transistor, respectively.

Still referring to FIG. 1, the sidewall 103B of the metal gate 103 is surrounded by the spacer 1037. A bottom 103A of the metal gate 103 is positioned over the semiconductor layer 100. In some embodiments, the metal gate 103 referred herein includes an optional interlayer 1030 between a horizontal portion of a high-k dielectric layer 1031 and the surface 100A.

The metal gate 103 further includes a capping layer 1033 formed on the high-k dielectric layer 1031, and a work function metal layer 1035 on the capping layer 1033.

The high-k dielectric layer 1031 has a bottom portion 1031A above the bottom 103A, and the capping layer 1033 has a bottom portion 1033A interfacing with the bottom portion 1031A of the high-k dielectric layer 1031. An interface 1020A between bottom portions 1031A and 1033A is proximal to the bottom of metal gate 103. The high-k dielectric layer 1031 has a sidewall portion 1031B lining with the spacer 1037.

The capping layer 1033 further has a sidewall portion 1033B interfacing with the sidewall portion 1031B of the high-k dielectric layer 1031. An interface 1020B between sidewall portions 1031B and 1033B is proximal to the sidewall of metal gate 103. The capping layer 1033 also has a corner portion 1033C, which is proximal to a corner portion of high-k dielectric layer 1031.

The sidewall profile of the capping layer 1033 has various configurations in order to adjust the distance from sidewall 103B to the work function metal layer 1035. Thus to improve electronic performance of the metal gate.

In some embodiments, capping layer sidewall portion 1033B has a non-uniform thickness. While being close to the metal gate bottom 103A, the thickness of the sidewall portion 1033B is designed to be thicker, and to be thinner while being close to top of the metal gate. For some embodiments, a thickest section of the sidewall 1033B is designed to be at a location that is proximal to the interface 1020A formed between the capping layer 1033 and high-k dielectric layer 1031.

In some embodiments, as illustrated by FIG. 1, a thickness of a sidewall portion 1033B more distal to the corner portion 1033C of the capping layer 1033 is substantially thinner than a thickness that is of a portion around the center of a bottom portion of the capping layer 1033. When a portion of the sidewall is thinner than the bottom portion, some issues, such as WCTO problem can be avoided.

For some embodiments, if the thickness around a center of the bottom portion 1033A of the capping layer 1033 is T1, a thickness of the sidewall portion 1033B at a point more distant from the interface 1020A, for example located from the interface 1020A at a distance greater than 4 times T1, is thicker than or equal to about 0. For example, if the thickness of the bottom portion 1033A is 50 Å (T1) and point X on the sidewall portion 1033B is about 250 Å, which is greater than 200 Å (four times of 50 Å), measured from the interface 1020A. The sidewall thickness on point X is thicker than or equal to about 0.

In some embodiments, when the thickness of the sidewall portion 1033B of the capping layer 1033, is thinner than about 0.5T1, an Ion-Isoff about 2% to 5% gain is observed.

In some embodiments, a point on the sidewall portion 1033B that is at a distance 4 times greater than T1 when measured from the interface 1020A, the thickness at that point is thinner than about 0.5T1. For example, if the thickness near the center of the bottom portion 1033A is 50 Å (T1), then a point X on the sidewall portion 1033B is about 250 Å, which is greater than 200 Å (four times of 50 Å), as measured from the interface 1020A. The sidewall thickness on point X is about 20 Å, which is thinner than about 25 Å (0.5T1).

Figure 2:
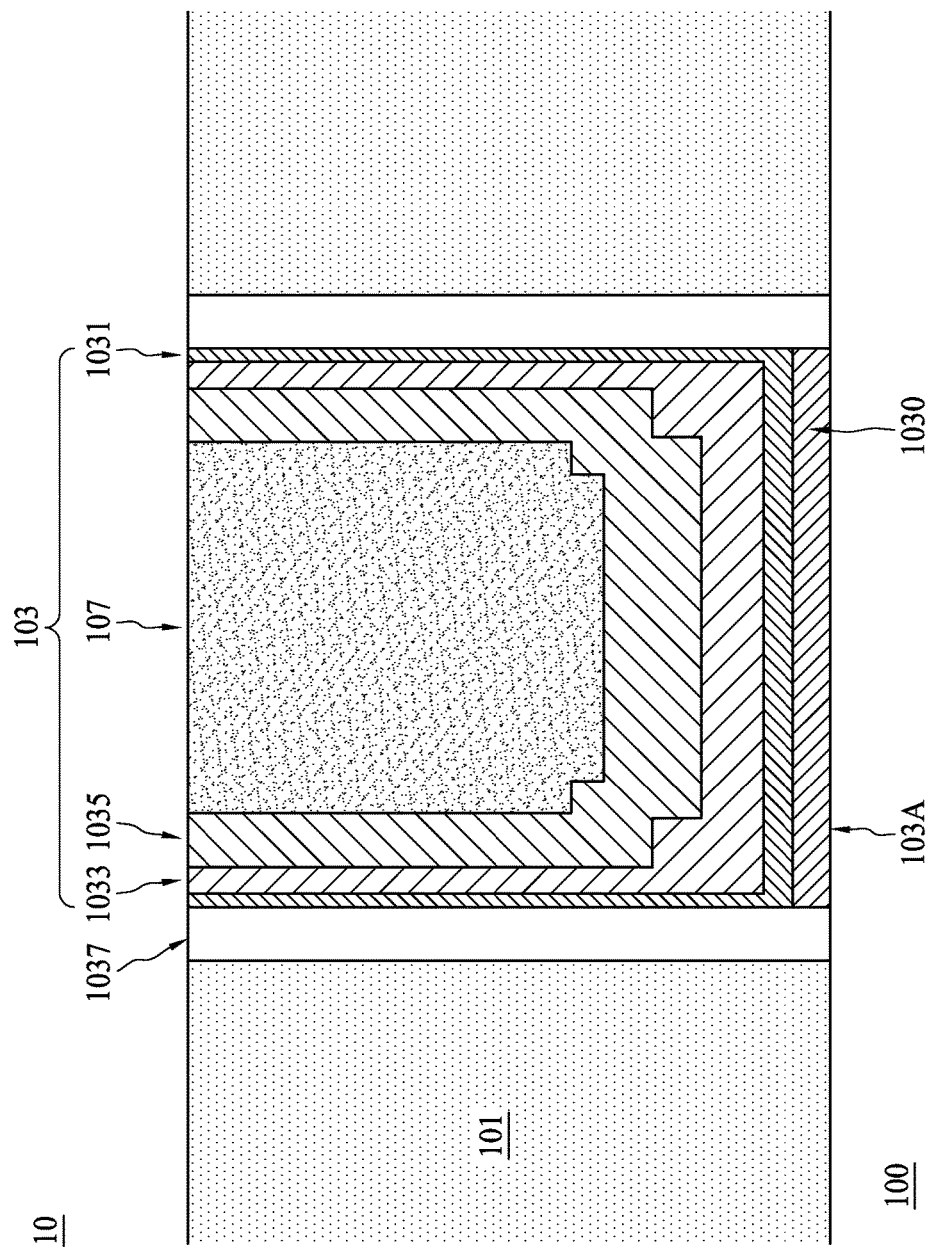
FIG. 2 is a cross sectional view of a semiconductor structure with a metal gate in accordance with some embodiments of the present disclosure.

The various capping layer sidewall configurations include several different shapes. In some embodiments, a portion of the capping layer sidewall is designed to be in a stepped configuration, as shown in FIG. 2.

For some other embodiments, thickness of a portion of the capping layer sidewall has a slope configuration. A point on the capping layer sidewall located from the interface 1020A at a certain position, for example greater than 4 times T1, the thickness starts decreasing gradually. The thinnest part of the capping layer sidewall is at the top of the metal gate 103.

For simplicity, all figures in the present disclosure, symbols of a symmetric structure will be marked only one side, such as 103B, 1020B, 1031B, 1033B, and 1033C, etc., it does not tend to limit the scope of the present disclosure.

In some embodiments, the ILD 101 includes a dielectric material. In some embodiments, the dielectric material includes silicon oxide, silicon nitride, silicon oxynitride, spin-on glass (SOG), fluorinated silica glass (FSG), carbon doped silicon oxide (e.g., SiCOH), BLACK DIAMOND® (Applied Materials of Santa Clara, Calif.), XEROGEL®, AEROGEL®, amorphous fluorinated carbon, Parylene, BCB (bis-benzocyclobutenes), FLARE®, SILK® (Dow Chemical, Midland, Mich.), polyimide, other proper porous polymeric materials, other suitable dielectric materials, and/or combinations thereof. In some embodiments, the ILD 101 includes a high density plasma (HDP) dielectric material (e.g., HDP oxide) and/or a high aspect ratio process (HARP) dielectric material (e.g., HARP oxide). It is understood that the ILD 101 may include one or more dielectric materials and/or one or more dielectric layers. The ILD 101 is planarized by a chemical-mechanical-polishing (CMP) process until a top portion of the metal gate 103 is exposed as illustrated in FIG. 1. The CMP process includes a high selectivity to provide a substantially planar surface for the metal gate 103, the spacers 1037, and ILD 101. In some embodiments, the CMP process has low dishing and/or metal erosion effect.

In some embodiments, for example, the spacer 1037 includes silicon oxide, silicon nitride, silicon oxynitride, other suitable materials, and/or combinations thereof. And the spacer can be formed by ALD, CVD, metalorganic CVD (MOCVD), PVD, plasma enhanced CVD (PECVD), plasma enhance ALD (PEALD), thermal oxidation, combinations thereof, or other suitable technique.

In some embodiments of the present disclosure, the high-k dielectric layer 1031 is formed by ALD, CVD, metalorganic CVD (MOCVD), PVD, plasma enhanced CVD (PECVD), plasma enhance ALD (PEALD), thermal oxidation, combinations thereof, or other suitable technique. In some embodiments, the high-k dielectric layer 1031 includes a thickness ranging from about 5 to about 30 Å. The high-k dielectric layer 1031 includes a binary or ternary high-k film. In some embodiments, the high-k dielectric layer 1031 includes LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

In some embodiments, the capping layer 1033 includes metal nitrides such as TiN, TaN, or metal carbonitride such as titanium carbonitride or other quaternary layer which has a general formula $(M_1, M_2)(C, N)$, wherein $M_1$ and $M_2$ are different metals of IVa or Va group. In some embodiments, the capping layer 1033 has a thickness ranging from about 2 Å to about 40 Å. The capping layer 1033 functions as a barrier to protect the high-k dielectric layer 1031. The capping layer 1033 is formed by various deposition techniques such as ALD, PVD, CVD, PECVD, or other suitable technique. In some embodiments as shown in FIG. 1, the capping layer 1033 is a composite film stack that includes at least two layers of materials. For example, one of the capping layers proximal to the high-k dielectric layer 1031 is made of metal nitrides or metal carbonitride of a first composition, whereas the other capping layer proximal to the work function metal layer 1035 is made of metal nitrides or metal carbonitride of a second composition. For example, the composite films of the work function metal layer 1035 can be identical but for the different atomic concentration of the compound. For example, the composite films of the work function metal layer 1035 can be different. For example, the composite films of the work function metal layer 1035 can be identical but are formed by different deposition operations. In some embodiments, the capping layer proximal to the high-k dielectric layer 1031 is called a barrier layer. In some embodiments, a thickness of the capping layers proximal to the high-k dielectric layer 1031 is of about from 1 to about 20 Å, and a thickness of the capping layers proximal to the work function metal layer 1035 is of about from 1 to about 20 Å.

In some embodiments, the work function metal layer 1035 includes metal carbonitride such as TiN, metal silicon nitride such as TiSiN, or metal aluminide. In some embodiments, the work function metal layer 1035 is made of metal carbonitride or metal silicon nitride. In other embodiments, the work function metal layer 1035 includes TiAlN, TiAl, or TaAl. The work function metal layer 1035 can be deposited through various deposition techniques such as ALD, PVD, CVD, PECVD, or other suitable technique. In some embodiments, a thickness of the work function metal layer 1035 is within a range of from about 1 Å to about 20 Å.

In some embodiments, a gate fill metal 107 is disposed in the metal gate 103. The gate fill metal 103 includes metals having a stand alone work function that is between 4.2 to 4.8 eV. In some embodiments, the gate fill metal includes W, Al, Co, and the alloys thereof. In some embodiments, a thickness of the gate fill metal 107 is between 50 to 3000 Å.

In some embodiments, the semiconductor structure 10 is a planar N-MOSFET or P-MOSFET with a channel length $L_g$ of from about 10 to about 40 nm. In other embodiments, the semiconductor structure 10 is a nonplanar N-FinFET or P-FinFET with a channel length $L_g$ of from about 5 to about 40 nm.

Figure 3:
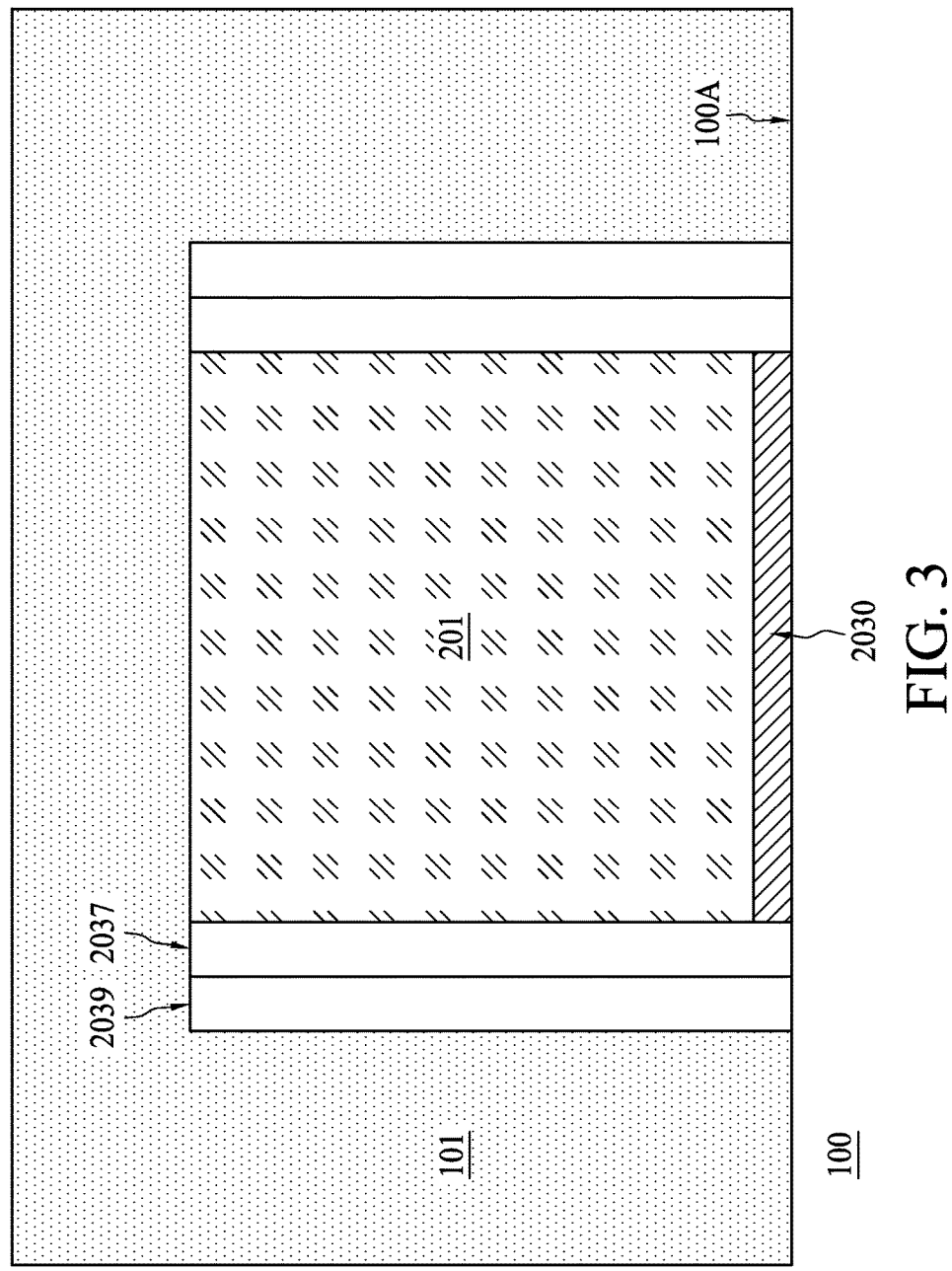
FIG. 3 is an operation of a semiconductor structure manufacturing method for a metal gate structure in accordance with some embodiments of the present disclosure.

FIG. 3 to FIG. 14 show the operations of a semiconductor structure manufacturing method for a metal gate structure in accordance with some embodiments of the present disclosure. A metal gate recess 203C is formed in operations described from FIG. 3 to FIG. 5. In FIG. 3, a sacrificial gate electrode 201 is capped within an ILD 101. An interlayer 2030, a spacer 2037, and a nitride layer 2039 are formed on a semiconductor layer 100 according to the current art. In some embodiments, the interlayer 2030 is ideally formed from a material which will not sufficiently etch during the removal or etching of the sacrificial gate electrode 201 so that it can protect the underlying semiconductor layer 100 when the sacrificial gate electrode 201 is subsequently removed. If the interlayer 2030 is a grown dielectric, it will form only on the exposed surfaces of the semiconductor layer 100. If the interlayer 2030 is a deposited film, it will be blanket deposited onto an insulating substrate (not shown) underneath the semiconductor layer 100 as well as onto the semiconductor layer 100.

In FIG. 3, the spacer 2037 and the nitride layer 2039 are formed on the sidewalls of the sacrificial gate electrode 201. The spacers 2037 and the nitride layer 2039 can be formed by blanket depositing a conformal dielectric film covering the top surface and the sidewall of the sacrificial gate electrode 201. The blanket deposited spacers 2037 are also formed on the surface 100A of the semiconductor layer 100. The materials forming the spacer 2037 and the nitride layer 2039 include, but not limited to, silicon nitride, silicon oxide, silicon oxynitride or combination thereof. In some embodiment of the present disclosure, the spacer 2037 is a silicon nitride film formed by a hot wall, low pressure chemical vapor deposition (LPCVD) operation. Next, the spacer 2037 and the nitride layer 2039 are anisotropically etched by, for example, plasma etching or reactive ion etching (RIE). The anisotropic etch of the spacer 2037 and the nitride layer 2039 removes the dielectric film from horizontal surfaces, such as the top of the sacrificial gate electrode 201 as well as the surface 100A of the semiconductor layer 100. In some embodiments, the RIE etch is continued for sufficient period of time to remove the spacer 2037 and the nitride layer 2039 from all horizontal surfaces.

Figure 4:
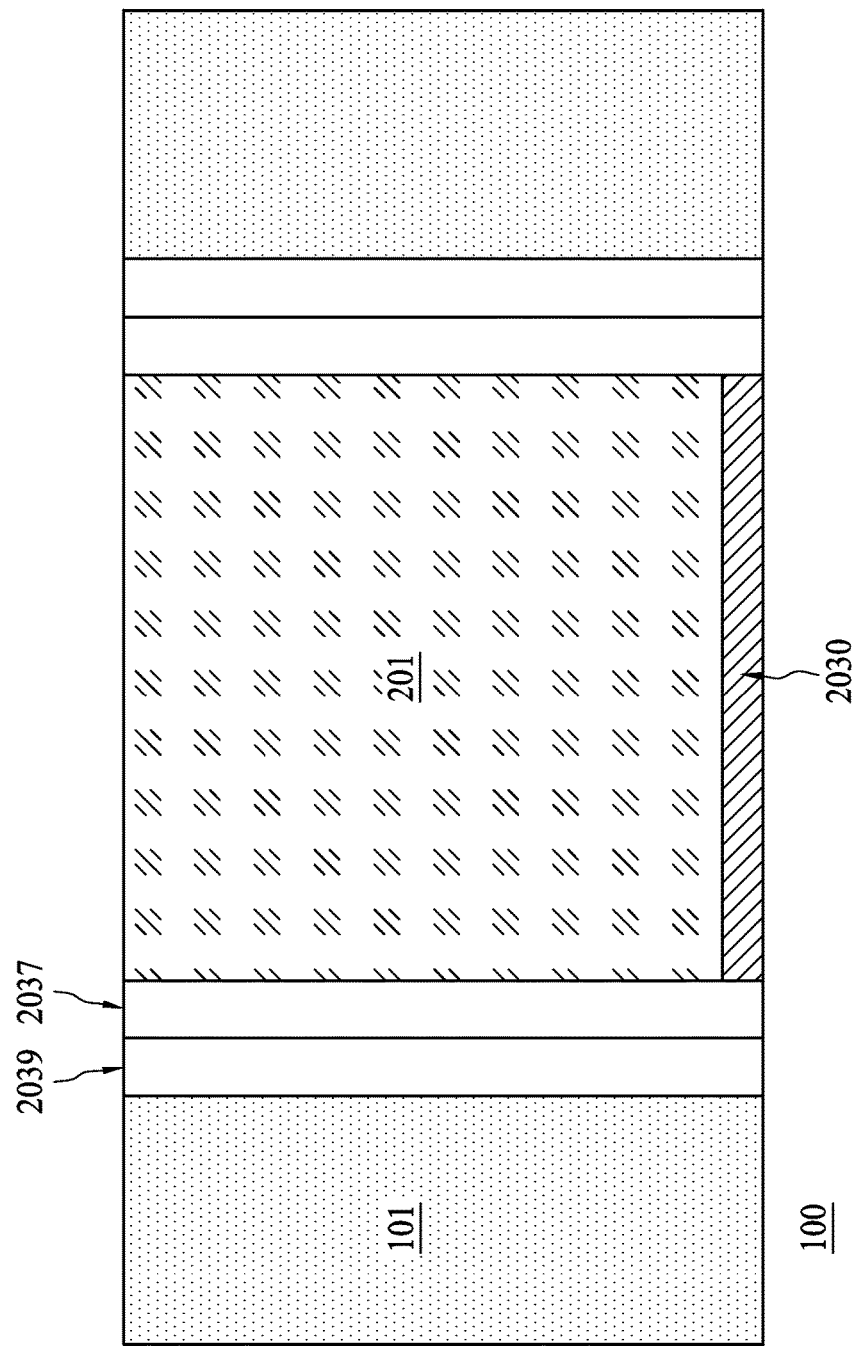
FIGS. 4 to 7 are operations of a semiconductor structure manufacturing method for a metal gate structure in accordance with some embodiments of the present disclosure.
Figure 5:
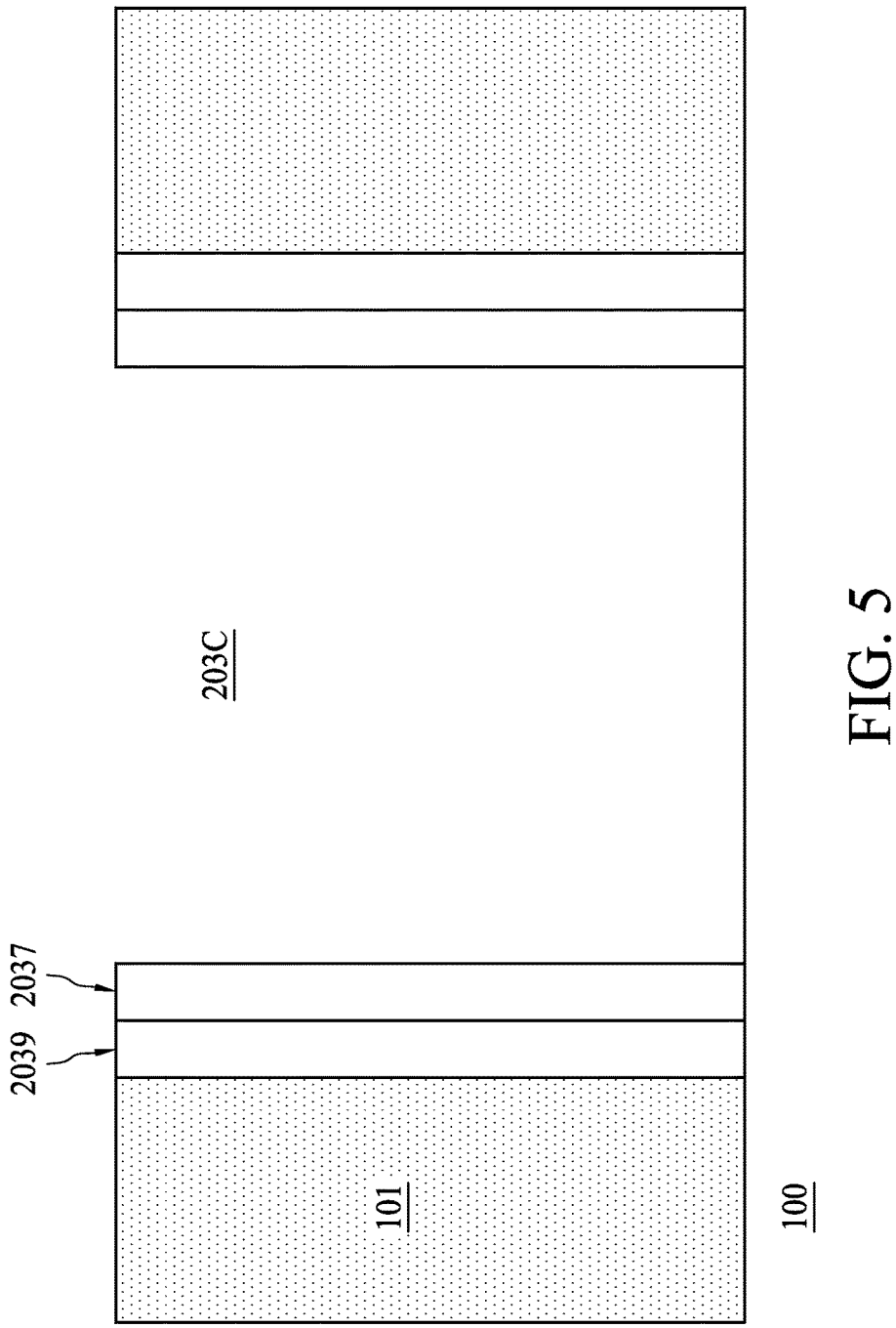

In FIG. 4, a planarization operation such as a chemical mechanical polishing (CMP) operation is performed after the formation of the spacer 2037, the nitride layer 2039, and the ILD 101. The planarization operation is carried out to remove the excessive ILD 101 over the top surface of the sacrificial gate electrode 201 until the sacrificial gate electrode 201 is exposed from the ILD 101. In FIG. 5, the metal gate recess 203C is formed by removing the sacrificial gate electrode 201 and the interlayer 2030. In some embodiments, the sacrificial gate electrode 201 is formed of polysilicon. The polysilicon sacrificial gate electrode 201 is removed by utilizing a wet etchant comprising tetramethylammonium hydroxide and water. In an embodiment of the present disclosure, tetramethylammonium hydroxide comprises between 10-35% of the solution by volume. In an embodiment of the present disclosure, the tetramethylammonium hydroxide solution is heated to a temperature between 60-95 degrees Celsius during the etching. In an embodiment of the present disclosure, sonic energy such as, ultrasonic or megasonic energy, is applied during the etch process. Sonic energy provides agitation to the etchant which enables etch residue to be removed from altered sacrificial gate electrode 201 and allows new etchant to enter into trench to etch the sacrificial gate electrode 201.

In some embodiments of the present disclosure, the etchant for sacrificial gate electrode 201 is selective to the interlayer 2030 (i.e., does not etch or only slightly etches the interlayer 2030) so that the interlayer 2030 acts as an etch stop for the sacrificial gate electrode 201 etch. In this way, the underlying channel regions of semiconductor layer 100 are protected from the etchant. In some embodiments, an etch selectivity between a sacrificial gate electrode to an interlayer dielectric of at least 10:1, is desired.

Next, the interlayer 2030 is removed. In an embodiment of the present disclosure, the interlayer 2030 is an oxide and can be removed with an etchant comprising aqueous hydrofluoric acid. In an embodiment of the present disclosure, a 1-2% HF by volume in water etchant is used.

Figure 6:
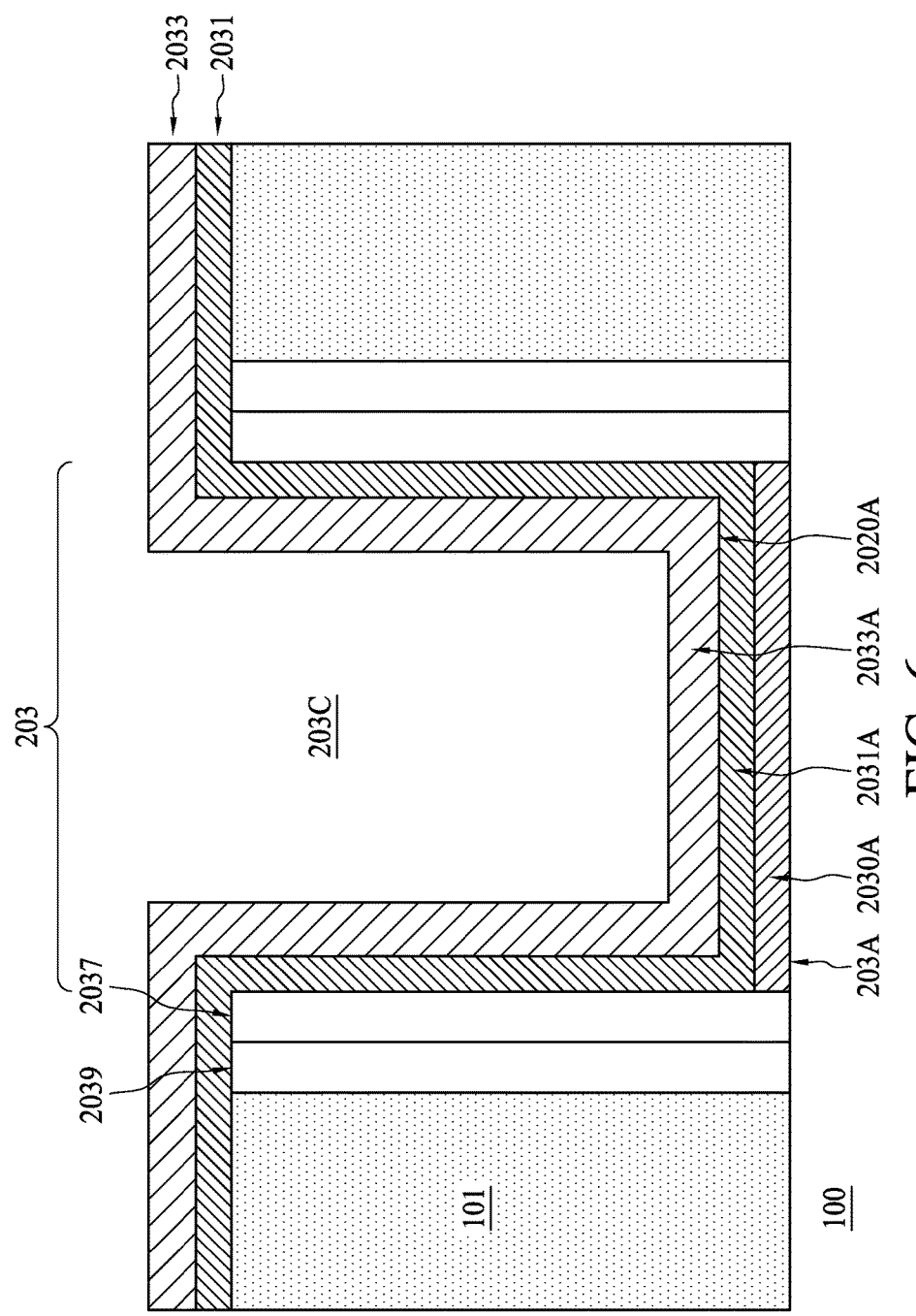

Referring to FIG. 6, an interlayer 2030A is formed on the bottom portion of the metal gate recess 203C, a high-k dielectric layer 2031, and a first capping layer 2033 is formed in a conformal manner inside the metal gate recess 203C and the top of the ILD 101. The high-k dielectric layer 2031 has a bottom portion 2031A above the bottom 203A, and the first capping layer 2033 has a bottom portion 2033A interfacing with the bottom portion 2031A of the high-k dielectric layer 2031. An interface 2020A between bottom portions 2031A and 2033A is proximal to the bottom of metal gate 203. In some embodiments, the interlayer 2030 does not exist, such that the high-k dielectric layer 2031 is directly formed proximal to the channel region of the semiconductor layer 100. In an embodiment of the present disclosure, the high-k dielectric layer 2031 is grown to a thickness of between 5-50 Å. In an embodiment of the present disclosure, the high-k dielectric layer 2031 is a deposited dielectric, such as but not limited to a metal oxide dielectric, such as tantalum pentoxide ($Ta_2O_5$) and titanium oxide ($TiO_2$), tantalum oxide, hafnium oxide, zirconium oxide, aluminum oxide, lanthanum oxide, lanthanum aluminum oxide and silicates thereof or other high k dielectrics, such as PZT and BST. The high-k dielectric film can be formed by a technique, such as but not limited to chemical vapor deposition (CVD) or atomic layer deposition (ALD). In some embodiments, the first capping layer 2033 is formed over the high-k dielectric layer 2031. In some embodiments, the first capping layer 2033 includes TiN or TaN having a thickness ranging from about 5 to about 30 Å. The first capping layer 2033 functions as a barrier to protect the high-k dielectric layer 2031. The first capping layer 2033 is formed by various deposition techniques such as ALD, PVD, CVD, PECVD, or other suitable techniques.

In some embodiments, the first capping layer 2033 includes a composite film stack. For example, the composite film stack can be made of any two of metal carbonitride layer, TiN, and TaN. In some embodiments, a first layer in the composite film stack (close to the high-k dielectric layer 2031) is formed by depositing a TiN film having a thickness of from about 1 to about 20 Å. A second layer in the composite film stack (close to a work function metal layer 2035, discussed later) is formed by depositing a TaN film having a thickness of from about 1 to about 20 Å

Figure 7:
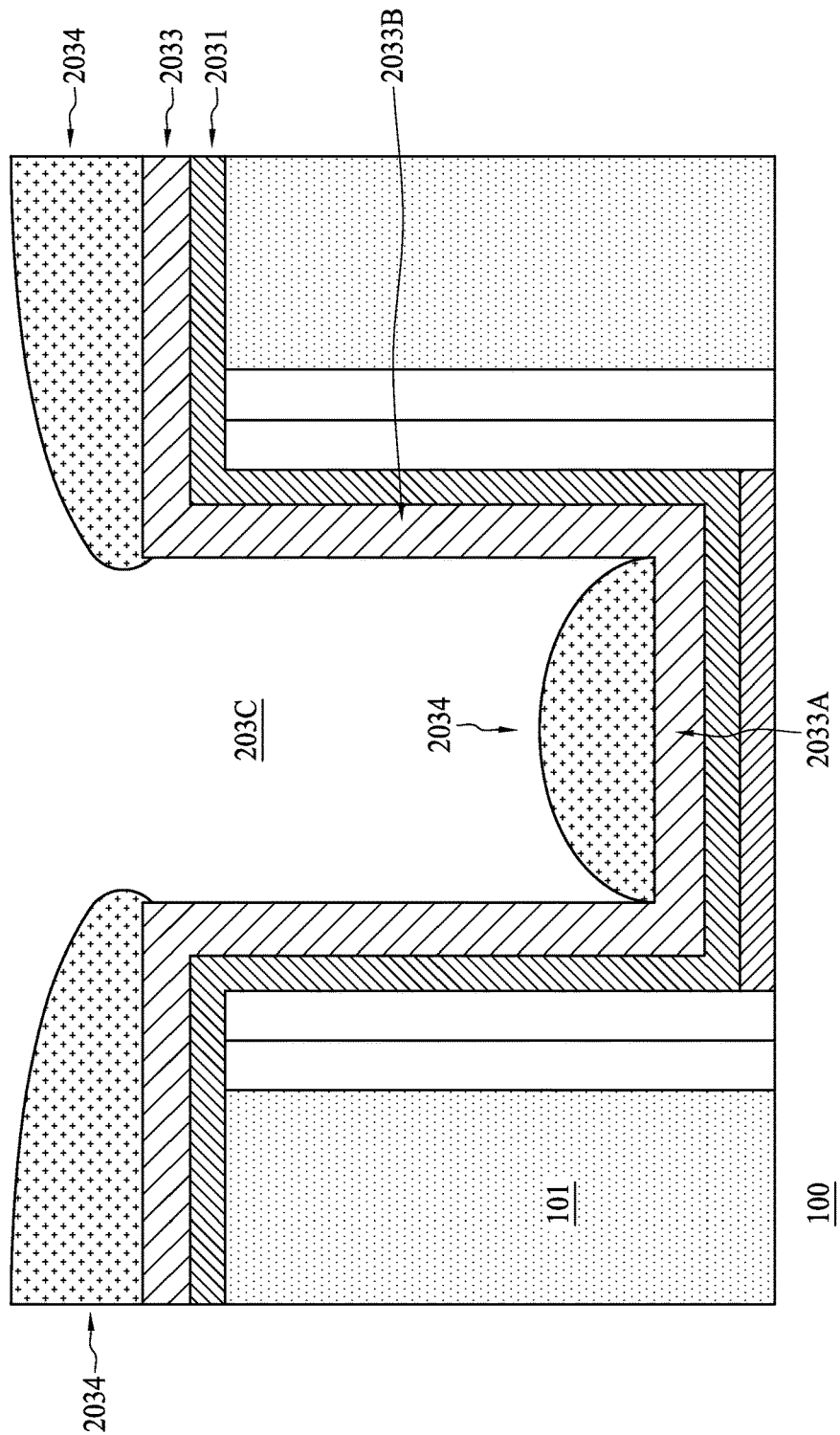
Figure 8:
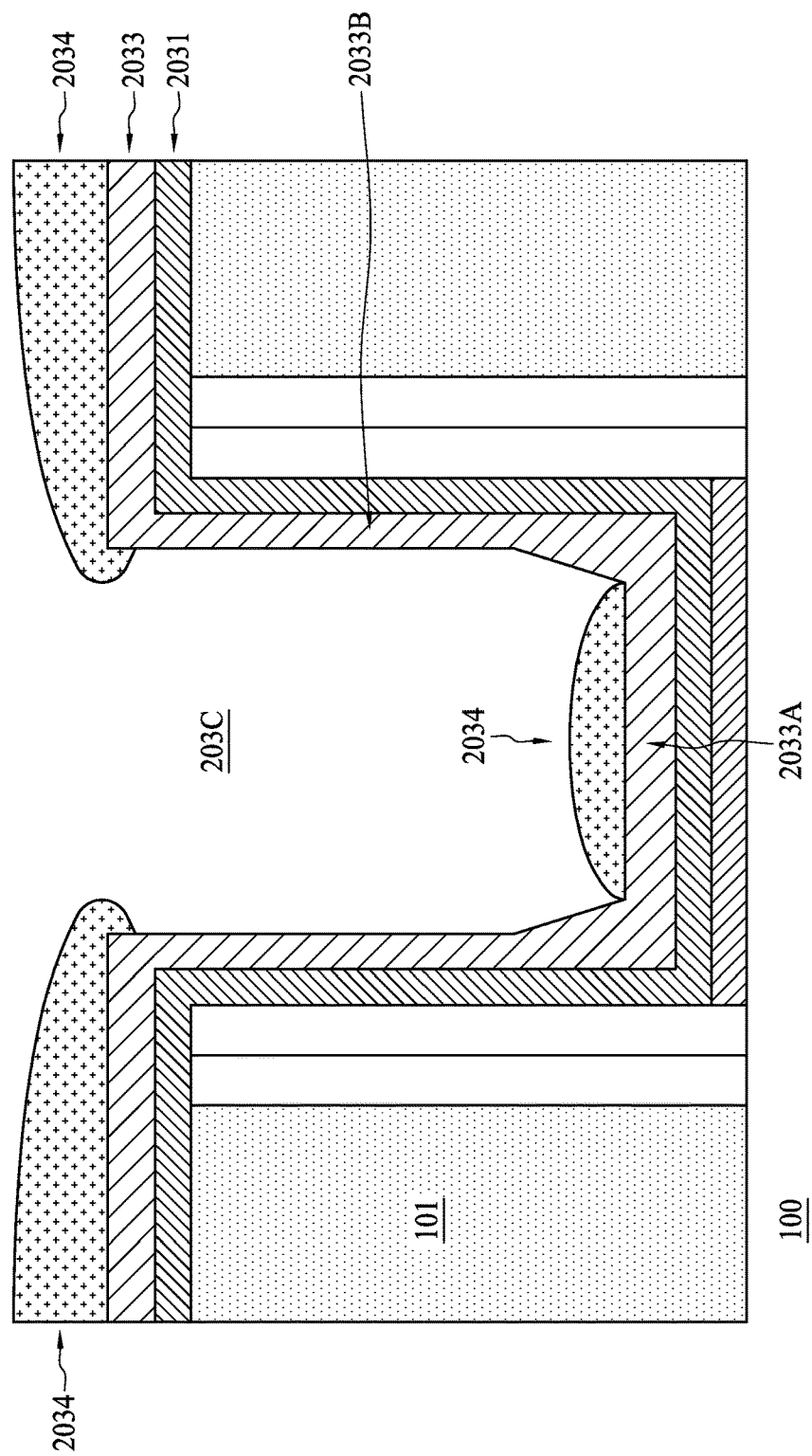
FIG. 8 is an operation of a semiconductor structure manufacturing method for a metal gate structure in accordance with some embodiments of the present disclosure.
Figure 9:
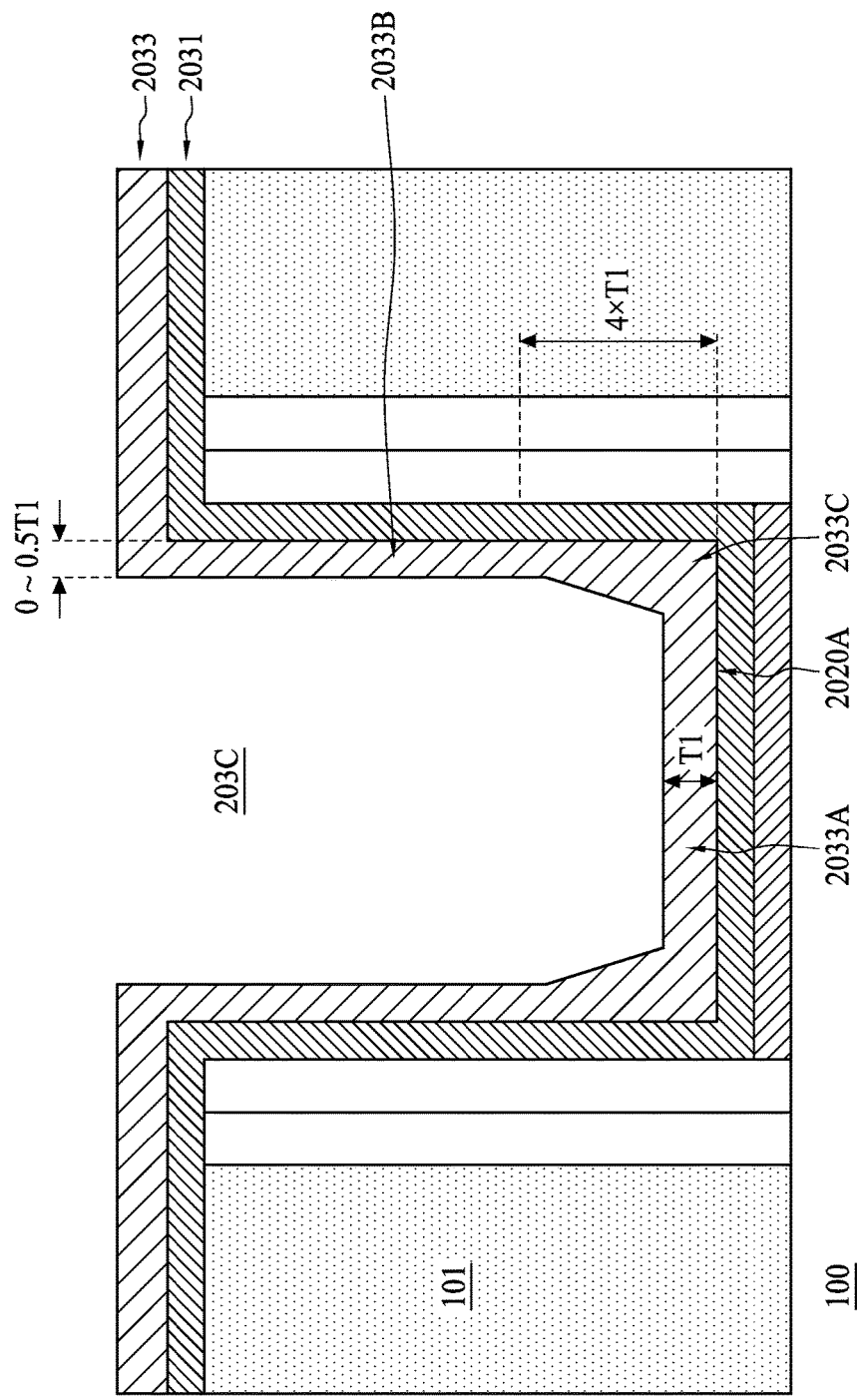
FIG. 9 is an operation of a semiconductor structure manufacturing method for a metal gate structure in accordance with some embodiments of the present disclosure.

FIG. 7 to FIG. 9 show operations of removing a sidewall portion 2033B of the first capping layer 2033. As shown in FIG. 7, a second capping layer 2034 is overfilled on the the first capping layer 2033. A thickness of the second capping layer 2034 on the first capping layer sidewall portion 2033B is substantially thinner than a thickness of the second capping layer 2034 on the first capping layer bottom portion 2033A. In some embodiments, there is no second capping layer 2034 on the sidewall portion 2033B of the first capping layer 2033, thus the sidewall portion 2033B of the first capping layer 2033 is exposed. In some embodiments, the second capping layer 2034 includes silicon oxide or silicon nitride. In some embodiments, the second capping layer 2034 is formed by CVD, ALD or PVD process. By forming the second capping layer 2034 on the first capping layer 2033, during a removing or thinning down step for removing or thinning down the sidewall portion 2033B of the first capping layer 2033 (the step will be discussed later), the second capping layer 2034 on the bottom portion 2033A of the first capping layer 2033A can protect the bottom portion 2033A of the first capping layer 2033 from removing. In other words, the second capping layer 2034 serves as a mask to minimize exposure of the bottom portion of the first capping layer 2033 during the following etch operations. To be more specific, the second capping layer 2034 is designed to substantially cover the whole area of bottom portion of the first capping layer 2033.

For some embodiments as in FIG. 7, sidewall of the first capping layer 2033 is exposed without the second capping layer 2034 disposed thereon. However, in other embodiments, there is a thinner coating of the second capping covering the sidewall of the first capping layer 2033. For either condition, with inadequate protection provided by the second capping layer, first capping sidewall is more vulnerable to a succeeding etch operation.

FIG. 8 illustrates the profile after introducing an etch operation after second capping deposition. Sidewall of the first capping layer 2033 is etched to be thinned or removed. The thinned down or removed amount of the first capping layer 2033's bottom portion 2033A is dependent on various factors. One of the factors is the thickness of the second capping layer 2034. In some embodiments, there is substantially no damage or thinning happened on the bottom portion 2033A when the second capping layer 2034's bottom portion is thick enough. In some other embodiments, when thickness of the second capping layer 2034's bottom portion is below a threshold value, a certain amount of the bottom portion 2033A is removed. However, since the sidewall portion 2033B has less protection coverage than the bottom portion 2033A, the removal amount for the sidewall portion 2033B is greater than that for the bottom portion 2033A, therefore a thin sidewall first capping profile is achieved.

In some embodiments, a wet etch operation is used to remove or thin down the sidewall of the first capping layer 2033. In some embodiments, the first capping layer 2033 is TiN and the second capping layer 2034 is silicon oxide, the wet etch used for removing or thinning down the sidewall of the first capping layer 2033 including $NH_3$ and $H_2O_2$. In some embodiments, the wet etch can remove or thin down the first and second capping layer substantially. In some embodiments, removing or thinning down the sidewall of the first capping layer 2033 comprises performing a selective etch operation between a nitride and an oxide.

The method proceed to FIG. 9 wherein shows the second capping layer 2034 is removed. To maintain the function of the first capping layer 2033 (as a barrier to protect the high-k dielectric layer 2031) or prevent reliability from decreasing, the removing operation for removing the second capping layer 2034 has a selectivity to the first capping layer 2033 (i.e., does not etch or only slightly etches the first capping layer 2033). In some embodiments, the etchant used for removing the second capping layer 2034 is HF.

The thickness around a center of bottom of the first capping layer 2033 is defined as T1. After removing the second capping layer 2034, thickness of the first capping layer sidewall portion 2033B at a point distant from the interface 2020A, for example, greater than 4 times T1, is thicker than or equal to about 0, and thinner than about 0.5T1. The removing or thinning down of a sidewall of the first capping layer 2033 where is proximal to corner of the first capping layer 2033 (2033C) is relatively hard to control, and thus a thickness of the remained sidewall portion 2033B proximal to the corner portion 2033C (for example, lower than 4 times T1 measured from the interface 2020A) may be thicker than the thickness of the sidewall portion 2033B at a distance greater than 4 times T1 measured from the interface 2020A.

Figure 10:
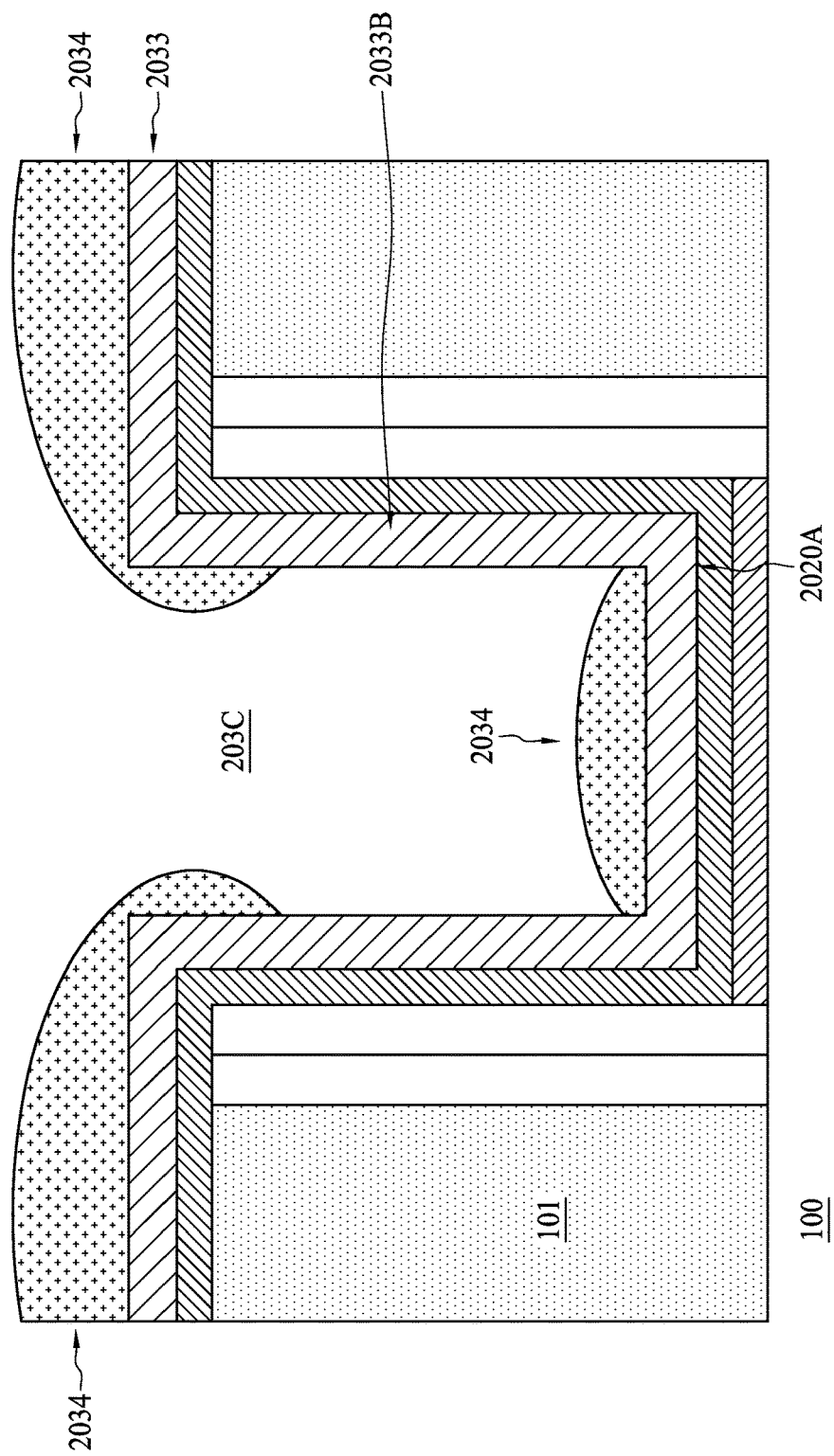
FIG. 10 is an operation of a semiconductor structure manufacturing method for a metal gate structure in accordance with some embodiments of the present disclosure.
Figure 11:
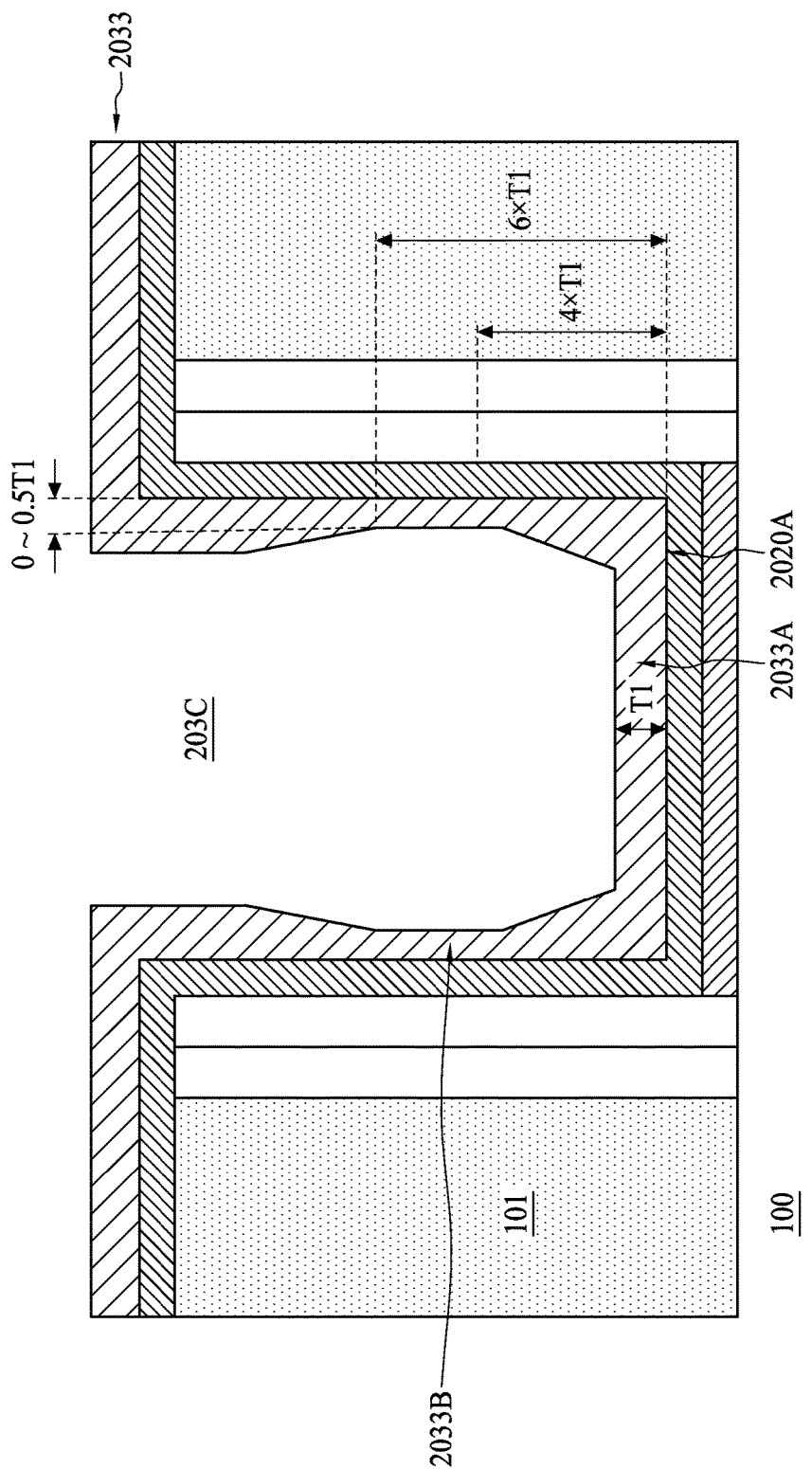
FIG. 11 is an operation of a semiconductor structure manufacturing method for a metal gate structure in accordance with some embodiments of the present disclosure.
Figure 12:
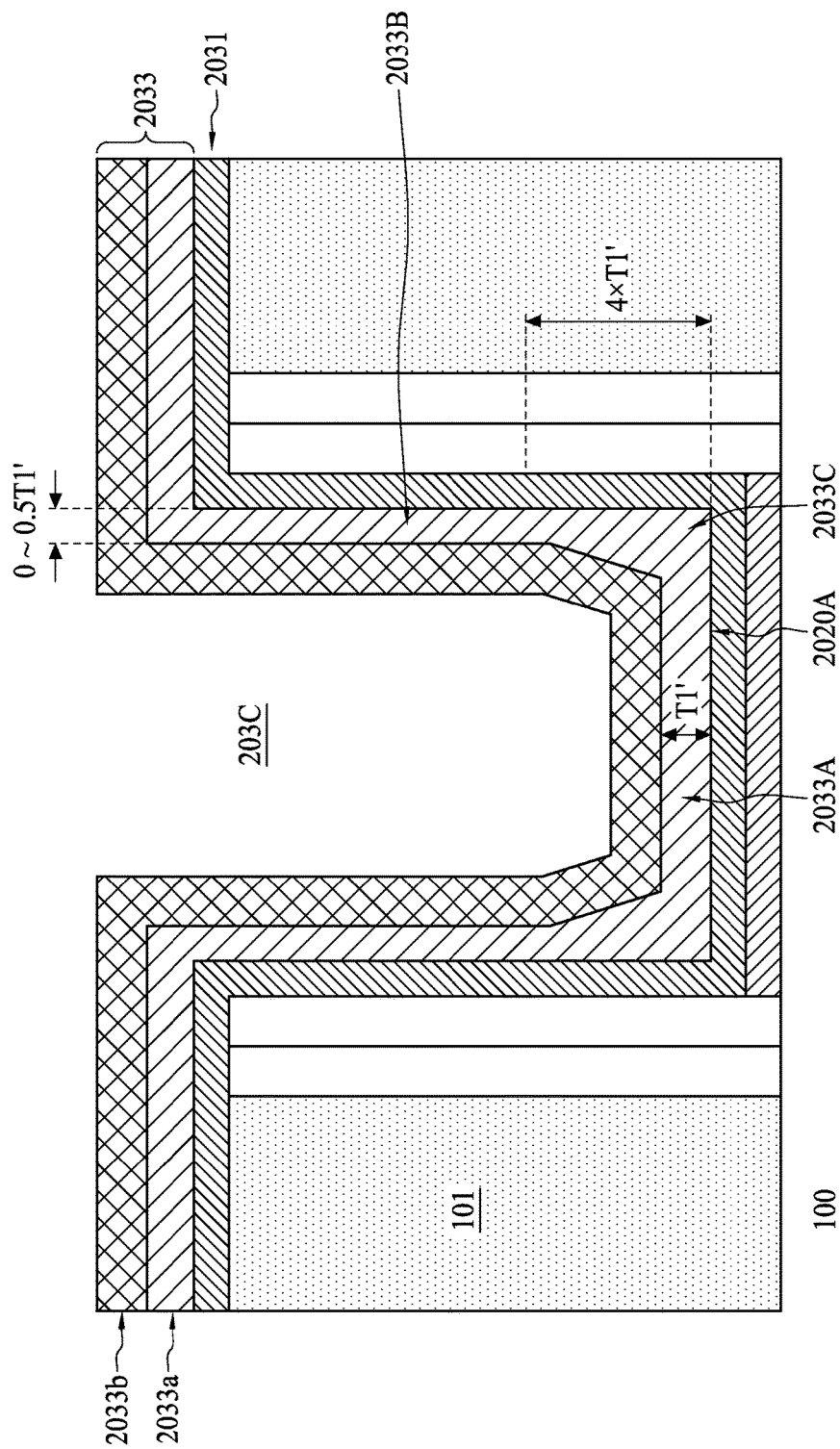
FIG. 12 is an operation of a semiconductor structure manufacturing method for a metal gate structure in accordance with some embodiments of the present disclosure.

FIG. 10 illustrates an example of forming a second capping layer 2034 with a less conformal PVD process, which may be an alternative of the operation illustrated in FIG. 7. Outstanding overhangs are formed on the top edge corners of the recess and the overhangs provide a mask to cover a portion of the first capping layer sidewall. Especially for the portion that is close to the top edge corners of the recess. This renders a better protection for some first capping sidewall at a location distall to the interface 2020A. FIG. 11 shows a first capping layer profile after a thinned down operation when adopting a PVD deposited second capping layer as whon in FIG. 10. The sidewall portion thickness of the first capping layer 2033 firstly decreases when the sidewall portion 2033B elevates a height of around 4T1 and then increases when the sidewall portion 2033B elevates a height of around 6T1. The thinnest point of the sidewall portion 2033B is located between 4T1 and 6T1.

As discussed above, the first capping layer 2033 includes a composite film stack, which can be made of any two of metal nitride layer. In some embodiments, the first layer in the first capping layer 2033 (close to the high-k dielectric layer 2031) is formed before the forming of the second capping layer 2034, and the second layer in the first capping layer 2033 (close to a work function metal layer 2035, will be discussed later) is formed after the removing of the second capping layer 2034. In some embodiments, the first layer or the second layer is a composite film. In some embodiments, both of the first layer and the second layer are composite film.

In some embodiments, only one layer in the first capping layer 2033 satisfies the condition: "the thickness of the sidewall portion is thinner than about 0.5 times of the thickness of the bottom portion and is thicker or equals to 0". For simplicity, defining the condition mentioned above as "condition A". For example, refer to FIG. 12, a first layer 2033a in the first capping layer 2033 has a thickness T1' around center of its bottom portion, satisfying condition A; but a second layer 2033b in the first capping layer is formed after the removing of the second capping layer 2034, so the thickness of sidewall portion of second layer 2033b may not be thinner than the bottom portion of the second layer 2033b. This results that the "total" capping layer 2033 including the first layer 2033a and the second layer 2033b does not satisfy condition A, but still has the partial removal of the sidewall of the first capping layer, resulting a horizontal shift of the subsequently formed work function metal layer 2035. In some embodiments, the second capping layer 2034 is formed after the formation of the second layer 2033b, and thus only the second layer 2033b satisfies condition A. The aforementioned alternatives are within the contemplating scope of the present disclosure.

To be more specific, the first capping layer 2033 includes at least one adjustment layer, wherein a bottom portion of the adjustment layer and a bottom portion of a layer under the adjustment layer, forms an adjustment interface proximal to the bottom of the metal gate 203. Further, a thickness around a center of the bottom portion of the adjustment layer is defined as T1', and a thickness of adjustment layer sidewall portion at a distance measured from the adjustment interface, for example, greater than 4 times T1' is thicker than or equal to about 0 and thinner than about 0.5T1'. The adjustment layer can be the first layer or the second layer in the first capping layer 2033. In some embodiments, the first layer or the second layer is a composite film.

Figure 13:
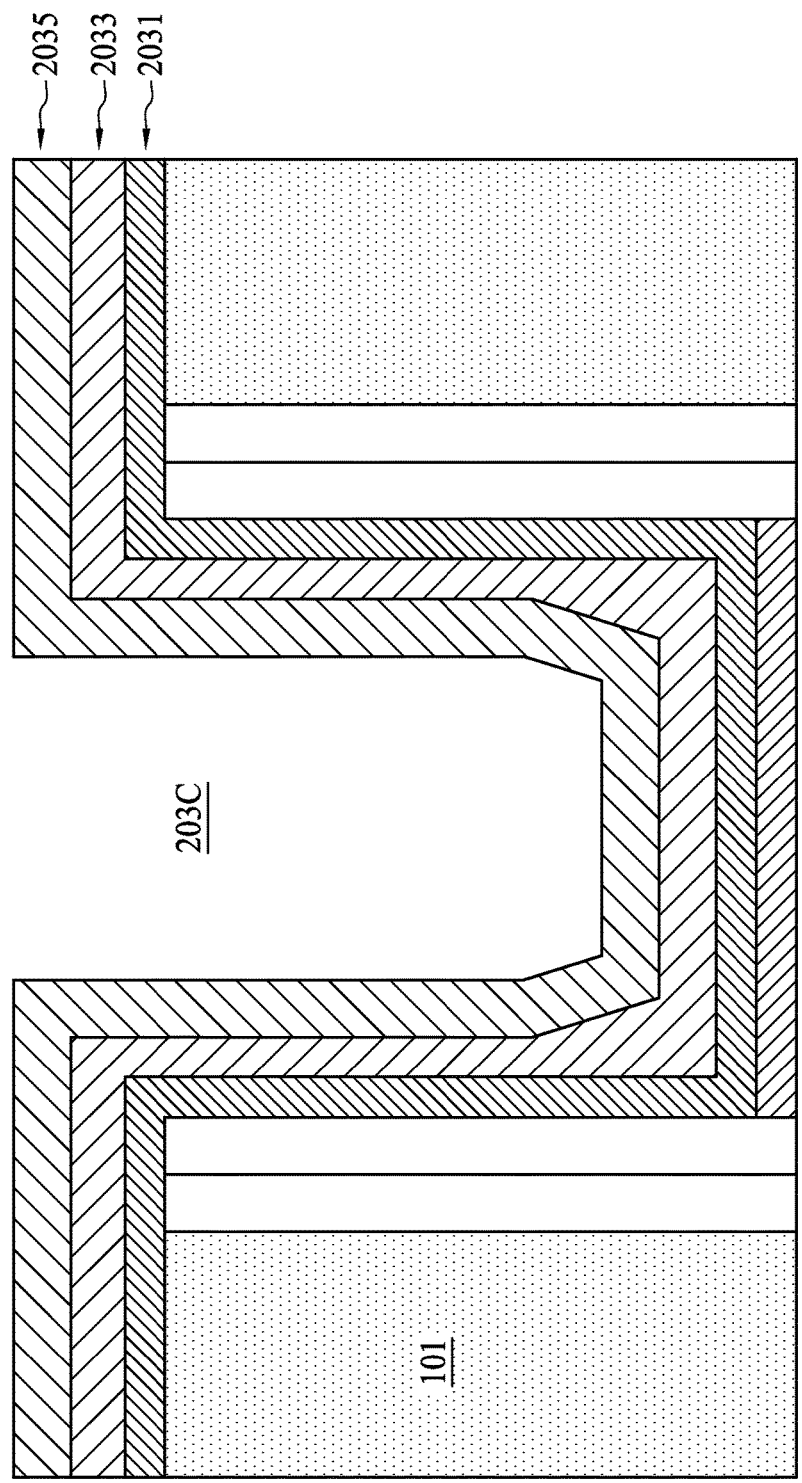
FIG. 13 is an operation of a semiconductor structure manufacturing method for a metal gate structure in accordance with some embodiments of the present disclosure.

In FIG. 13, a work function metal layer 2035 is formed on the first capping layer 2033 (and on the high-k dielectric layer 2031, if there is no first capping layer 2033 on the sidewall of the high-k dielectric layer 2031, in some embodiments). In some embodiments, the work function layer 2035 is formed on the first capping layer 2033 by an atomic layer deposition, a physical vapor deposition, a chemical vapor deposition, sputtering, or other suitable operations. In some embodiments, the work function metal layer 2035 includes suitable metals such as metal carbonitride, metal aluminide, metal silicon nitride, TiN, TiSiN, TiAlN, TiAl, TaAl, TaN, or Ru, that properly perform in an N-type transistor. In some embodiments, the N work function layer 2035 includes a multi-metal layer structure such as TiN/WN. In some embodiments, aluminum atom is doped within the work function metal layer 2035 via an ALD operation. In other embodiments, an aluminum ion implantation operation is carried out after the formation of the work function metal layer 2035 in order to adjust the threshold voltage or the work function of the metal gate electrode for an N-type transistor.

Figure 14:
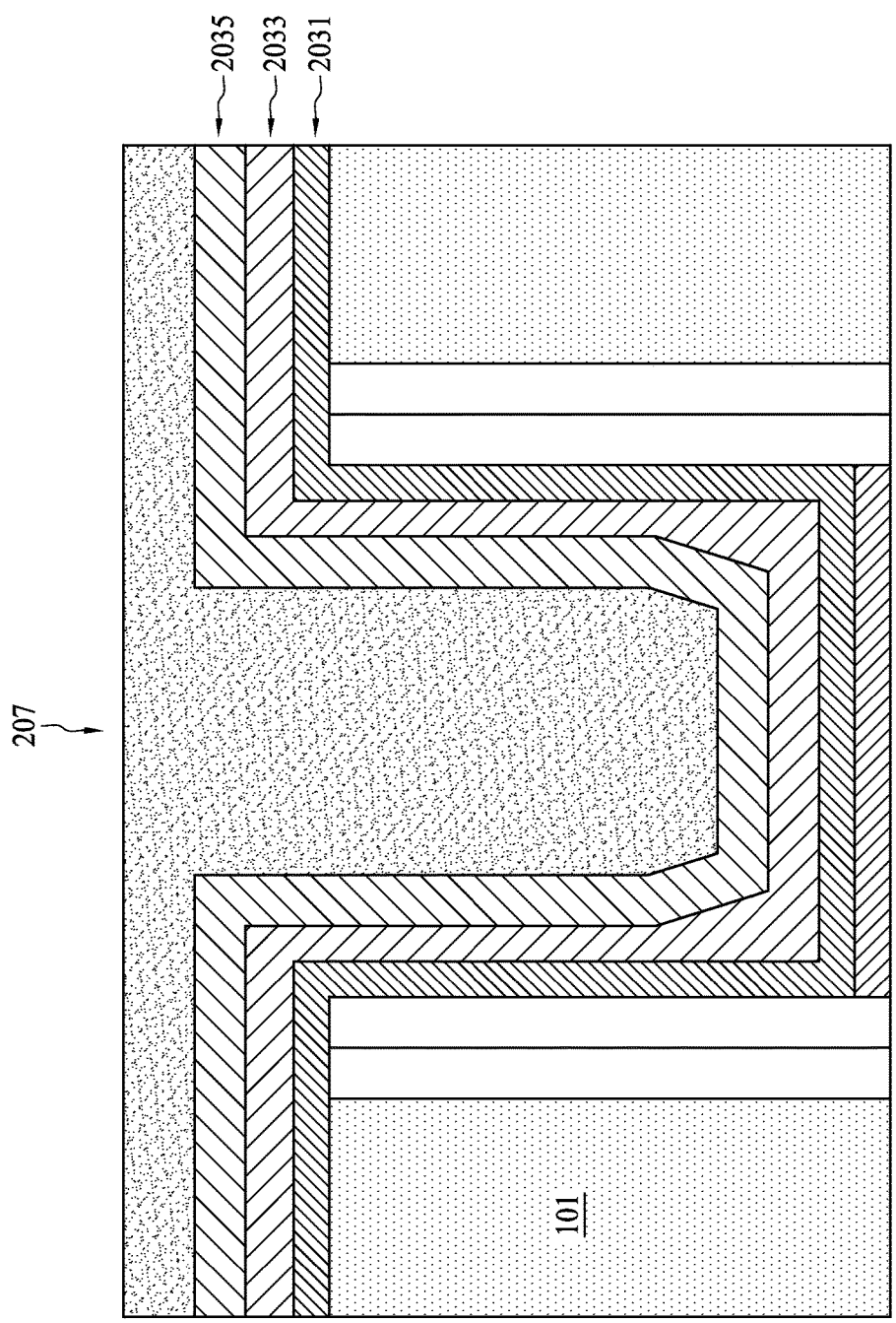
FIG. 14 is an operation of a semiconductor structure manufacturing method for a metal gate structure in accordance with some embodiments of the present disclosure.
Figure 15:
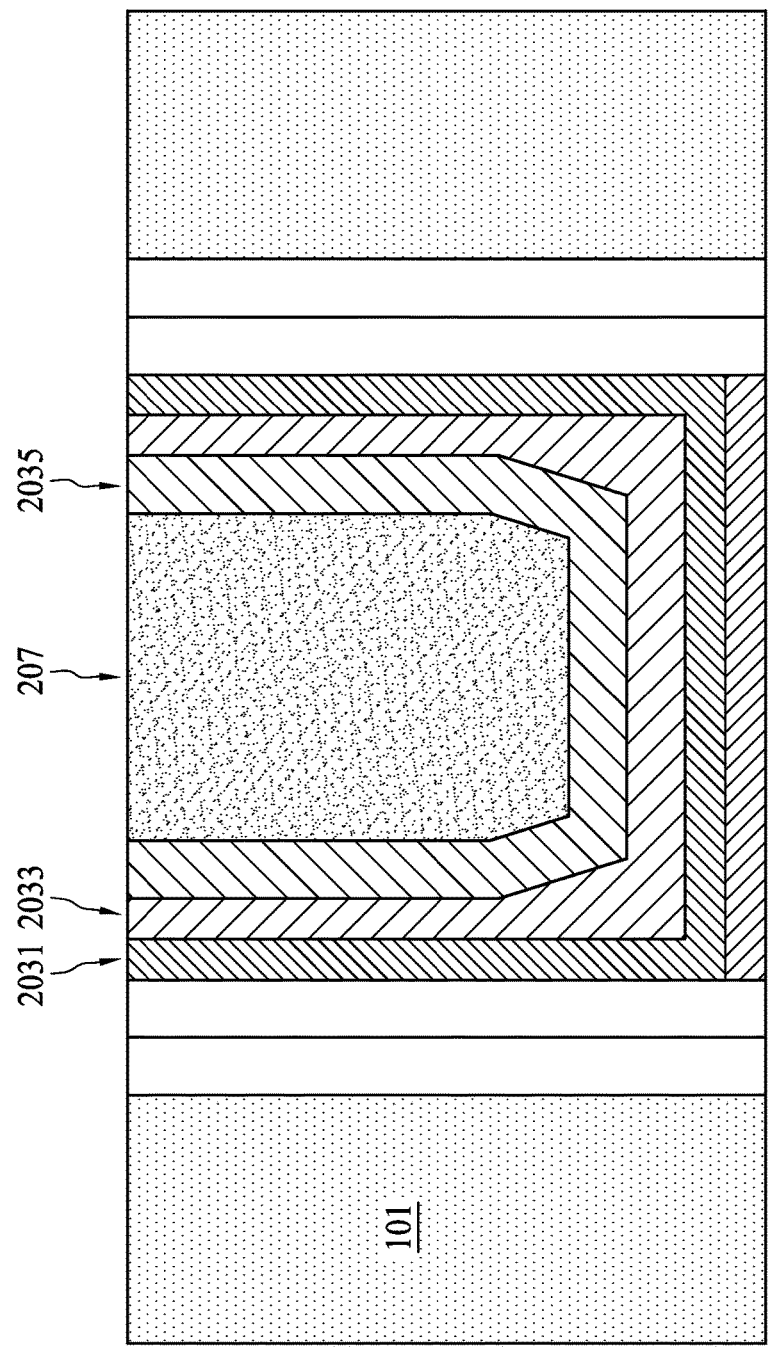
FIG. 15 is an operation of a semiconductor structure manufacturing method for a metal gate structure in accordance with some embodiments of the present disclosure.

Referring to FIG. 14, a gate fill metal 207 is overfilled into the metal gate recess 203C as shown in FIG. 13. In some embodiments, a single metal including Al, W, WN, TaN, or Ru is sputtered into the metal gate trench 203C, and followed by a CMP operation to remove the overfilled gate fill metal 207, the work function metal layer 2035, the first capping layer 2033 and the high-k dielectric layer 2031 on a top surface of the ILD 101, as shown in FIG. 15. In some embodiments, the gate fill metal 207 includes a composite film stack structure such as TaN, TiN, W, WN, and WCN, or any combination thereof.

Some embodiments of the present disclosure provide a semiconductor structure. The semiconductor structure includes a semiconductor layer having a surface and an interlayer dielectric (ILD) defining a metal gate over the surface of the semiconductor layer. The metal gate includes: a high-k dielectric layer lining the metal gate recess's sidewall and bottom; a capping layer on the high-k dielectric layer; a work function metal layer on the first capping layer (and on the high-k dielectric layer, if there is no first capping layer on the high-k dielectric layer sidewall) and a gate fill metal on the work function metal layer. A thickness around a center of the first capping layer bottom is defined as T1, a thickness of the capping layer sidewall at a distance measured from the interface greater than 4 times T1, is thicker than or equal to about 0 and thinner than about 0.5T1.

In some embodiments, the thickness of the sidewall portion of the first capping layer of the metal gate of the semiconductor structure is zero.

In some embodiments, a height of a bottom portion of the first capping layer of the metal gate of the semiconductor structure is more than 2 Å.

In some embodiments, no first capping layer is on the sidewall portion of the metal gate of the semiconductor structure.

In some embodiments, the first capping layer of the metal gate of the semiconductor structure includes a composite film stack.

In some embodiments, the thickness of the sidewall portion of the first capping layer is thinner than the thickness of the bottom portion of the first capping layer of the metal gate.

In some embodiments, the first capping layer is a composite film stack between the work function metal layer and the high-k dielectric layer.

In some embodiments, a thickness around center of the bottom portion of the capping layer is of from about 2 Å to about 40 Å.

In some embodiments, a thickness of the work function metal layer is of from about 1 Å to about 20 Å.

In some embodiments, the work function metal layer comprises aluminum.

In some embodiments, the work function metal layer comprises a composite film stack.

In some embodiments, the semiconductor structure is an N-MOSFET or an N-FinFET.

In some embodiments, the semiconductor structure is a P-MOSFET or aP-FinFET.

Some embodiments of the present disclosure provide a method for manufacturing a semiconductor structure. The method includes forming a metal gate recess in an interlayer dielectric (ILD); forming a high-k dielectric layer lining the metal gate recess, forming a capping layer in a bottom and a sidewall of the metal gate recess; removing or thinning down a sidewall portion of the capping layer; forming a work function metal layer on the capping layer; and overfilling a gate fill metal to level the metal gate recess.

In some embodiments, the removing or thinning down the sidewall portion of the first capping layer in the method for manufacturing a semiconductor structure includes filling a second capping layer on the first capping layer, wherein a thickness of the second capping layer on the sidewall portion of the first capping layer is substantially thinner than a thickness of the second capping layer at bottom.

In some embodiments, no second capping layer is on the sidewall portion of the capping layer.

In some embodiments, thickness of a bottom portion of the second capping layer is about 1 Å to about 20 Å.

In some embodiments, the removing or thinning down the sidewall portion of the first capping layer in the method for manufacturing a semiconductor structure includes performing a wet etch operation or a dry etch operation selective between a nitride and an oxide.

In some embodiments, the method for manufacturing a semiconductor structure further includes removing the overfilled gate fill metal and the work function metal layer from a top surface of the ILD.

In some embodiments, the method for manufacturing a semiconductor structure further includes an ion implantation operation.

Moreover, the scope of the present application is not intended to be limited to the particular embodiments of the process, machine, manufacture, and composition of matter, means, methods and steps described in the specification. As those skilled in the art will readily appreciate form the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure.

Accordingly, the appended claims are intended to include within their scope such as processes, machines, manufacture, and compositions of matter, means, methods or steps. In addition, each claim constitutes a separate embodiment, and the combination of various claims and embodiments are within the scope of the disclosure.

What is claimed is:

1. A semiconductor structure, comprising:
  a semiconductor substrate having a surface;
  an interlayer dielectric (ILD) defining a recess over the surface of the semiconductor substrate;
  a spacer lining a sidewall of the recess;
  a high-k dielectric layer lining a bottom of the recess and a sidewall of the spacer;
  a capping layer on the high-k dielectric layer, wherein a bottom of the capping layer and a bottom of the high-k dielectric layer form an interface proximal to the bottom of the recess; and
  a work function metal layer on the capping layer;
  wherein a first total thickness around a center of the bottom of the capping layer is T1, and a second total thickness of a sidewall of the capping layer has a gradation from the semiconductor substrate to an inflection point measured at a location distant from the interface by greater than 4 times T1, and the second total thickness of the sidewall of the capping layer at the inflection point is greater than zero and less than about 0.5 times T1.

2. The semiconductor structure in claim 1, wherein the location at which the second total thickness of the sidewall portion of the capping layer is measured is distant from the interface by less than 6 times T1.

3. The semiconductor structure in claim 1, wherein the capping layer comprises a composite film stack.

4. The semiconductor structure in claim 3, wherein the capping layer comprises at least one adjustment layer, wherein a bottom portion of the adjustment layer and a bottom portion of a layer on the adjustment layer form an adjustment interface proximal to the bottom of the recess; and
wherein a thickness around a center of the bottom portion of the adjustment layer is defined as T1', a thickness of a sidewall portion of the adjustment layer, measured at a point at a distance from the adjustment interface which is greater than 4 times T1', is less than about 0.5 times T1'.

5. The semiconductor structure in claim 1, wherein the work function metal layer comprises a composite film stack.

6. The semiconductor structure in claim 1, wherein the semiconductor structure is an N-MOSFET or a P-MOSFET.

7. A semiconductor structure in a FinFET, comprising:
a semiconductor substrate having a surface;
an interlayer dielectric (ILD) defining a recess over the surface of the semiconductor substrate;
a spacer lining a sidewall of the recess;
a high-k dielectric layer lining a bottom of the recess and a sidewall of the spacer;
a capping layer on the high-k dielectric layer, wherein a bottom portion of the capping layer and a bottom portion of the high-k dielectric layer form an interface proximal to the bottom of the recess, and the capping layer further comprises an end portion substantially leveled with a top surface of the sidewall of the high-k dielectric layer; and
a work function metal layer on the capping layer;
wherein a first total thickness around a center of the bottom portion of the capping layer is defined as T1, and a second total thickness of a sidewall portion of the capping layer, measured at a first location distant from the interface by greater than 6 times T1, is greater than a third total thickness of the sidewall portion of the capping layer, measured at a second location distant from the interface by greater than 4 times T1 and by less than or equal to 6 times T1.

8. The semiconductor structure in claim 7, wherein the third total thickness of the sidewall portion of the capping layer measured at the second location is less than about 0.5 times T1.

9. The semiconductor structure in claim 7, wherein the capping layer comprises a composite film stack.

10. The semiconductor structure in claim 9, wherein the capping layer comprises at least one adjustment layer, wherein a bottom portion of the adjustment layer and a bottom portion of a layer on the adjustment layer form an adjustment interface proximal to the bottom of the recess; and
wherein a fourth total thickness around a center of the bottom portion of the adjustment layer is defined as T1', and a fifth total thickness of a sidewall portion of the adjustment layer measured at a location distant from the adjustment interface by greater than 4 times T1' is less than about 0.5 times T1'.

11. The semiconductor structure in claim 7, wherein the work function metal layer comprises a composite film stack.

12. The semiconductor structure in claim 7, wherein the semiconductor structure is an N-MOS FinFET or a P-MOS FinFET.

13. A semiconductor structure, comprising:
a spacer;
a metal gate, comprising:
a dielectric layer including a bottom portion; and
a capping layer on the dielectric layer, the capping layer being configured to attract carriers in a channel region of a transistor and comprising:
a bottom portion proximal to a bottom of the metal gate; and
a sidewall portion proximal to a sidewall of the metal gate,
wherein the bottom portion of the capping layer and the bottom portion of the dielectric layer form an interface proximal to the bottom of the metal gate, and
wherein a first total thickness around a center of the bottom portion of the capping layer is defined as T1, and
wherein a second total thickness of the sidewall portion of the capping layer measured at a first location distant from the interface by greater than 6 times T1 is greater than a third total thickness of the sidewall portion of the capping layer measured at a second location distant from the interface by greater than 4 times T1 and by less than or equal to 6 times T1, the third total thickness being less than about 0.5 times T1.

14. The semiconductor structure in claim 13, wherein the dielectric layer further comprises a sidewall portion interfacing the sidewall portion of the capping layer.

15. The semiconductor structure in claim 13, wherein a thinnest portion of the sidewall portion of the capping layer is distant from the interface by between 4 times T1 and 6 times T1.

16. The semiconductor structure in claim 13, wherein the sidewall portion of the capping layer has a top thicker than the third thickness of the sidewall portion.

17. The semiconductor structure in claim 13, wherein a fourth total thickness of the sidewall portion of the capping layer measured at a third location distant from the interface between the bottom portion of the capping layer and the bottom portion of the dielectric layer by greater than 4 times T1 is less than about 0.5 times T1.

18. The semiconductor structure in claim 13, wherein a thickness of the sidewall portion of the capping layer proximal to the bottom of the metal gate is thicker than that proximal to a top of the metal gate.

19. The semiconductor structure in claim 13, wherein a thickness of the sidewall portion of the capping layer decreases gradually in the upwards direction away from the bottom of the metal gate.

* * * * *